United States Patent
Djahanshahi et al.

(10) Patent No.: US 9,787,251 B2
(45) Date of Patent: *Oct. 10, 2017

(54) ELECTRO-MECHANICAL OSCILLATOR AND METHOD FOR GENERATING A SIGNAL

(71) Applicant: Maxlinear Asia Singapore PTE LTD, Singapore (SG)

(72) Inventors: Hormoz Djahanshahi, Port Moody (CA); Su-Tarn Lim, Toronto (CA)

(73) Assignee: Maxlinear Asia Singapore PTE LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,188

(22) Filed: Aug. 8, 2016

(65) Prior Publication Data
US 2017/0033739 A1    Feb. 2, 2017

Related U.S. Application Data

(63) Continuation of application No. 14/736,763, filed on Jun. 11, 2015, now Pat. No. 9,438,166, which is a
(Continued)

(51) Int. Cl.
*H03B 5/32*      (2006.01)
*H03L 3/00*      (2006.01)
(Continued)

(52) U.S. Cl.
CPC .............. *H03B 5/326* (2013.01); *H03B 5/06* (2013.01); *H03B 5/30* (2013.01); *H03B 5/36* (2013.01);
(Continued)

(58) Field of Classification Search
CPC ... H03B 5/06; H03B 5/36; H03B 5/32; H03B 5/364; H03B 2200/0094; H03B 2200/0034
See application file for complete search history.

(56) References Cited

U.S. PATENT DOCUMENTS 6,696,899 B2    2/2004   Ruffieux
6,828,844 B2   12/2004   Suzuki et al.
(Continued)

OTHER PUBLICATIONS

Ruffieux, "A High-Stability, Ultra-Low-Power Differential Oscillator Circuit for Demanding Radio Applications", Proc. of European Solid-States Circuit Conference, 2002, pp. 85-88.
(Continued)

*Primary Examiner* — Ryan Johnson
(74) *Attorney, Agent, or Firm* — McAndrews, Held & Malloy

(57) ABSTRACT

An oscillator and method for generating a signal are provided. The oscillator comprises an electro-mechanical resonator and a reconfigurable oscillator driver. The reconfigurable oscillator driver starts the oscillator in single-ended mode to avoid latching and transitions the oscillator to differential mode in such a manner as to sustain oscillations therein. The reconfigurable oscillator driver may comprise two back-to-back banks of inverters and an adjustable feedback resistor. In single-ended mode, one bank is disabled and the other bank is enabled. To transition to differential mode and improve the quality of the signal, the number of enabled inverters is equalized in both banks.

28 Claims, 12 Drawing Sheets

Related U.S. Application Data continuation of application No. 13/909,739, filed on Jun. 4, 2013, now Pat. No. 9,071,194.

(51) Int. Cl.
  *H03B 5/30* (2006.01)
  *H03B 5/36* (2006.01)
  *H03B 5/06* (2006.01)

(52) U.S. Cl.
  CPC .............. *H03B 5/364* (2013.01); *H03L 3/00* (2013.01); *H03B 2200/009* (2013.01); *H03B 2200/0034* (2013.01); *H03B 2200/0046* (2013.01); *H03B 2200/0094* (2013.01)

(56) References Cited

U.S. PATENT DOCUMENTS

| | | | |
|---|---|---|---|
| 6,956,443 B2 | 10/2005 | Ruffieux | |
| 7,019,598 B2 | 3/2006 | Duncan et al. | |
| 7,123,109 B2 * | 10/2006 | Stevenson | H03B 5/06 331/109 |
| 7,170,357 B1 | 1/2007 | Driscoll et al. | |
| 7,312,672 B2 | 12/2007 | Yamamoto | |
| 7,362,193 B2 | 4/2008 | Mattisson | |
| 7,482,888 B1 | 1/2009 | Kleveland | |
| 7,545,229 B2 | 6/2009 | Rohde et al. | |
| 8,040,190 B2 | 10/2011 | Ruffieux | |
| 8,519,800 B1 | 8/2013 | Wagner et al. | |
| 8,854,147 B2 * | 10/2014 | Lin | H01L 27/0255 331/116 FE |
| 9,071,194 B1 * | 6/2015 | Djahanshahi | H03B 5/30 |
| 9,438,166 B1 * | 9/2016 | Djahanshahi | H03B 5/30 |
| 2006/0049883 A1 | 3/2006 | Mattisson | |
| 2009/0039970 A1 | 2/2009 | Shen et al. | |
| 2011/0291767 A1 | 12/2011 | Ishikawa et al. | |
| 2014/0070897 A1 * | 3/2014 | Brekelmans | H03B 5/36 331/109 |

OTHER PUBLICATIONS

Westra et al., "Resonance-Mode Selection and Crosstalk Elimination Using Resonator-Synchronized Relaxation Oscillators", Proc. of European Solid-States Circuit Conference, 1998, 4 pages.

Hu et al., "A 50ppm 600 MHZ Frequency Reference Utilizing the Series Resonance Utilizing the Series Resonance of an FBAR", IEEE Radio Frequency Integrated Circuits Symposium, 2010, pp. 325-328.

U.S. Appl. No. 13/909,739, Notice of Allowance dated Feb. 23, 2015.

Shi et al., "A Sub-100uW 2GHz Differential Colpitts CMOS/FBAR VCO", IEEE Custom Integrated Circuits Conference, 2011, pp. 4 pages.

U.S. Appl. No. 14/335,842 Office Action dated Jun. 25, 2015.

U.S. Appl. No. 13/909,739, Office Action dated Sep. 19, 2014.

* cited by examiner

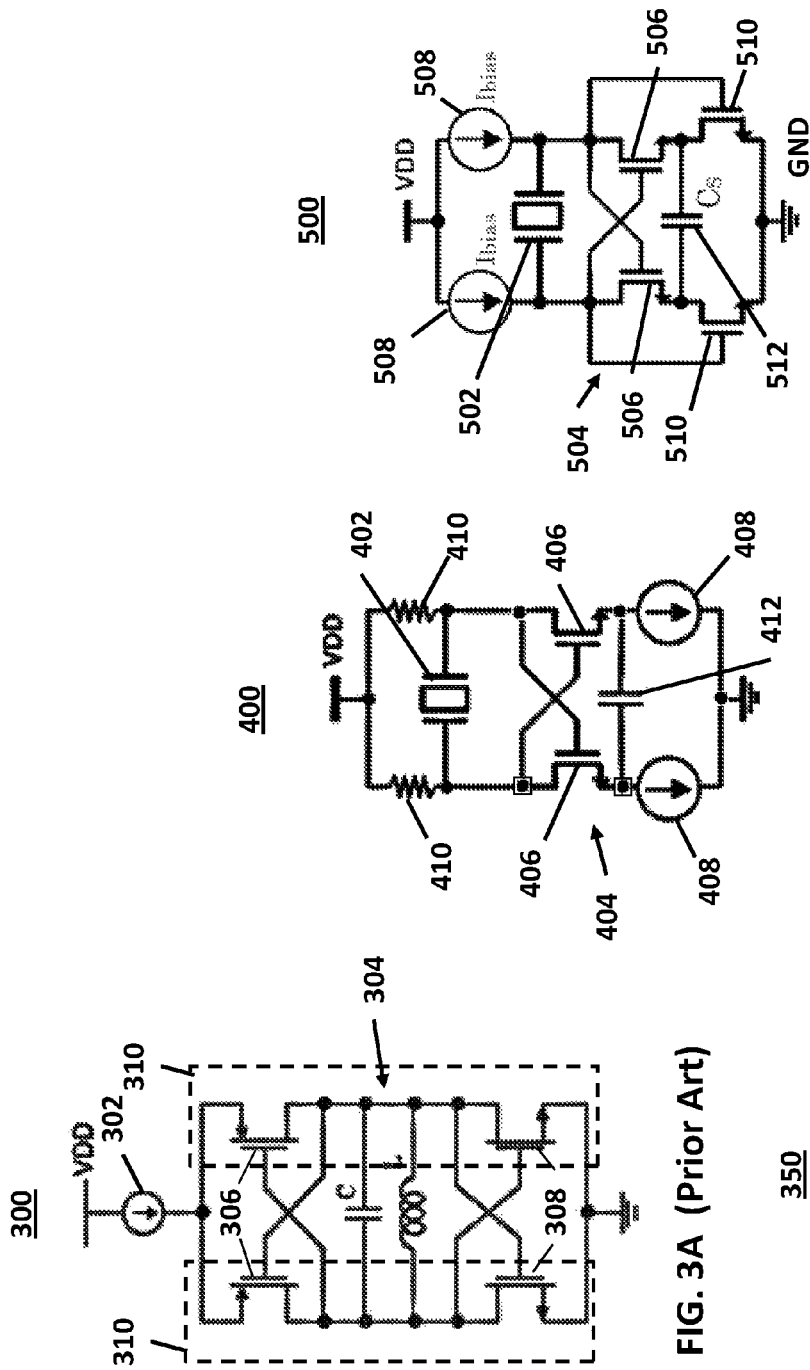
FIG. 5 (Prior Art)
FIG. 4 (Prior Art)
FIG. 3A (Prior Art)
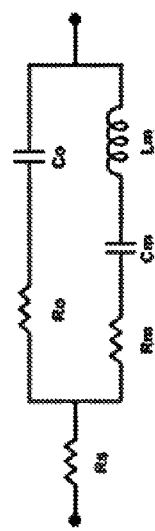
FIG. 3B (Prior Art)

ELECTRO-MECHANICAL OSCILLATOR AND METHOD FOR GENERATING A SIGNAL

CROSS REFERENCE TO RELATED APPLICATIONS

This application is a continuation of application Ser. No. 14/736,763 filed on Jun. 11, 2015, which in turn is a continuation of U.S. patent application Ser. No. 13/909,739 filed on Jun. 4, 2013, now U.S. Pat. No. 9,071,194. The entirety of each of the above referenced documents is incorporated herein by reference in its entirety.

FIELD

The present disclosure relates generally to the field of oscillators. More particularly, the present disclosure relates to generating signals using an oscillator with an electro-mechanical resonator.

BACKGROUND

Oscillators are electrical devices that generate an oscillating or repetitive, signal. The signal comprises a voltage which varies in magnitude and sign over time. The signal can be a sinusoidal wave, such as in an analog signal, or a square wave, such as in a digital or electronic signal. Signals generated by an oscillator, especially electronic signals, have a number of applications such as, for example, a precise reference clock source, in a voltage-controlled oscillator for frequency tuning, or in a phase-locked loop for locking onto another signal.

A common type of oscillator is an LC oscillator. An LC oscillator consists of an inductor (L) and a capacitor (C) connected in parallel or in series to form a resonator. In this arrangement, electrical charge flows back and forth, as a harmonic oscillation (oscillations), between the plates of the capacitor through the inductor. LC oscillators generally, and LC oscillators in integrated circuits specifically, do not have a high quality factor. For example, LC oscillators in an integrated circuit have a quality factor between 5 and 25. The quality factor of an oscillator describes how under-damped its resonator is—the higher the quality factor, the lower the rate of energy loss relative to the stored energy of the oscillator. A loaded quality factor is the quality factor a resonator when "loaded" or combined with additional losses due to the circuitry attached thereto. Because LC oscillators have a low quality factor, oscillations therein quickly die out unless powered by another source.

Electro-mechanical resonators are devices which can be employed within oscillators to control the frequency and improve the quality of oscillations. This, accordingly, improves the phase purity of the signal produced by the oscillator. A piezoelectric resonator is a type of electro-mechanical resonator. In a piezoelectric resonator, a voltage or charge applied to the resonator generates a mechanical strain in the resonator. Conversely, a mechanical strain applied to the resonator causes the resonator to generate a charge and voltage difference across its terminals. When the resonator forms part of a circuit, energy in the resonator oscillates between mechanical energy and electrical energy causing the resonator to physically vibrate during oscillation. Resonators inherently resonate at particular frequencies or their resonance frequencies. The physical dimensions of the resonator determine its resonance frequencies. For example, in bulk-acoustic wave (BAVV) resonators, the thickness determines the wave length and hence the frequency.

A common resonator is a quartz crystal. Oscillators which use this type of resonator are known as crystal oscillators (XOs). Quartz resonators operate at resonance frequencies ranging from tens of kilohertz (kHz) to tens of megahertz (MHz), with the overtone (harmonic) oscillations being up to a few hundreds of MHz. Although a thinner quartz resonator creates oscillations with a shorter wavelength and a higher frequency, there is a limit to how thin a quartz resonator can be cut. Accordingly, there is also a limit on the maximum achievable resonance frequency produced in an oscillator using a quartz resonator.

Other types of piezoelectric resonators include, but are not limited to, film bulk acoustic resonator (FBAR) resonators and bulk acoustic wave (BAVV) resonators. These types of resonators can be made micrometers thick and, accordingly, can operate in the gigahertz (GHz) resonance frequency range. They can also be used within oscillators to provide a high quality factor, and can handle high power. A BAW resonator, for example, comprises a thin layer of piezoelectric material such as aluminum nitride (AlN). On each side of the material is a metal electrode for conducting a current or voltage to the material. The quality factor of an FBAR/BAW resonator is between 500 and 3000 when operating in the 1-7 GHz range. This is significantly greater than the quality factor of oscillators using integrated LC resonators, which is approximately between 5 and 25 when operating in the same multi-gigahertz frequency range. Another type of piezoelectric resonator is a surface acoustic wave (SAW) resonator.

Quartz crystal and SAW resonators as well as FBAR/BAW resonators require active drive circuitry to initially excite, and then maintain, the resonator's oscillations. Oscillators comprise this active drive circuitry. The active drive circuitry effectively creates a negative transconductance (or negative resistance) that cancels out the positive resistance associated with the losses in the resonators thereby sustaining the resonator's oscillations.

A 3-point oscillator, also known as a single-ended Pierce oscillator, is a stable active drive circuit which is combined with piezoelectric resonators for wired and wireless communication systems.

FIG. 1 shows a single-ended oscillator 100. The oscillator comprises a resonator 102, and a feedback gain stage 104. The gain stage consists of a feedback bias resistor 106 in combination with a transistor 108 for providing a negative transconductance to overcome losses in the resonator 102. The oscillator 100 also comprises load capacitors 110 which help cancel out the inductive behavior of the resonator 102 near parallel resonance frequencies (the self-resonance frequency of the resonator where it acts like an open circuit).

FIG. 2 shows another single-ended oscillator 200 that is similar to the single-ended oscillator 100 shown in FIG. 1, the difference being that the gain stage 204 uses a CMOS inverter logic gate 208.

A balanced oscillator, also known as a differential oscillator, is another type of oscillator that can be combined with a resonator to generate a signal. A differential oscillator produces differential signals. Differential signals are, when viewed together, a pair of complementary signals with better common-mode noise rejection and increased oscillation swing across the resonator as compared to the signal from a single-ended oscillator.

FIG. 3A shows a differential LC oscillator 300 arranged as a negative resistance active circuit. The oscillator 300 comprises a current source 302, an LC resonator 304, and a pair of cross-coupled PMOS transistors 306 connected in parallel with a pair of cross-coupled NMOS transistors 308 so as to create two back-to-back inverters 310. The back-to-back inverters 310 provide negative resistance to the LC resonator 304 for oscillation. Negative resistance replaces the energy lost by the resonator 304, thereby maintaining its vibration and, accordingly, the oscillations in the LC oscillator 300. To commence oscillation of the oscillator 300, Gate terminals of all transistors 306, 308 are initially shorted together through the direct current (DC) path in the inductor. Any electrical noise present in the oscillator 300 will then force the terminals of the LC resonator 304 to toggle and oscillate. Only the resonance frequency, however, will be selected by the resonator and amplified by the transistors in the loop of the oscillator 300. The LC resonator 304 cannot easily be substituted with a piezoelectric resonator, however, to improve the oscillator's 300 quality factor.

FIG. 3B shows a modified Butterworth-Van-Dyke (mBVD) circuit model 350 of a piezoelectric resonator. The circuit model 350 is essentially a lumped resistance (R), inductance (L), and capacitance (C) equivalent circuit. If the LC resonator 304 is replaced with the circuit model 350 of the piezoelectric resonator, and a direct current applied to thereto, the resonator behaves like an open circuit. The gate voltages of the transistors 306, 308 in the oscillator 300 latch to complementary high and low voltage levels due to the infinite-gain direct current response, instead of oscillating between two voltages.

To help prevent latching when using a piezoelectric resonator in a differential oscillator, a shunt resistor with a low impedance is used to provide a bias path. The shunt resistor needs to have a small resistance, however, reducing the quality factor of the resonator and degrading the phase noise of the oscillation signal.

Another option to help prevent latching in a differential oscillator when using a piezoelectric resonator is to insert capacitors between two "half circuits" to cut off the low-frequency and DC gain.

FIG. 4 shows a differential oscillator 400 with a piezoelectric resonator 402, cross-coupled transistors 404 realizing negative resistance (comprising two NMOS transistors 406), two DC current sources 408, resistors 410 and a capacitor 412. The capacitor 412 is positioned between two "half circuits" to reduce low-frequency gain and DC gain, and inhibits the gate voltages of the transistors 406 from latching to the complementary high and low voltages. This approach, however, may result in spurious oscillations and phase noise in the electronic signal. Namely, charging and discharging the capacitor 404 creates a periodic modulation that either appears as sidebands in the oscillator's electronic signal, or overcomes the electronic signal creating unwanted "relaxation oscillations". The value of the capacitor 404, accordingly, needs to be sufficiently small to avoid unwanted modulations in the signal. A small capacitor, however, will cause degradation in the main oscillation swing, and phase noise degradation in the signal. This oscillator 400 is also difficult to implement since the common-mode voltage (the voltage about which the electronic signal oscillates) at the terminals of the resonator 402 depend on the values of the current sources 408 and resistors 410. The current sources 408 and resistors 410, moreover, reduce the voltage headroom for oscillation and degrade the phase noise performance.

FIG. 5 shows a differential oscillator 500 similar to the differential oscillator 400 shown in FIG. 4. The differential oscillator 500 has two NMOS transistors 510 (one on each side of the transistors 506) between the capacitor 512 and ground GND. The NMOS transistors 510 provide negative feedback to stabilize the common-mode voltages at the terminals of the resonator 502. The current sources 508 and the NMOS transistors 510, however, also occupy voltage headroom thereby degrading the phase noise performance of the signal produced by the oscillator 500.

BRIEF DESCRIPTION OF THE DRAWINGS

Embodiments of the present disclosure will now be described, by way of example only, with reference to the attached figures.

FIG. 3A shows a differential oscillator with an LC resonator as known in the art.

FIG. 3B shows a modified Butterworth-Van-Dyke (mBVD) circuit model 350 of a piezoelectric resonator.

FIG. 4 shows a differential oscillator with a piezoelectric resonator as known in the art.

FIG. 5 shows another differential oscillator with a piezoelectric resonator as known in the art.

DETAILED DESCRIPTION

Figure 2:
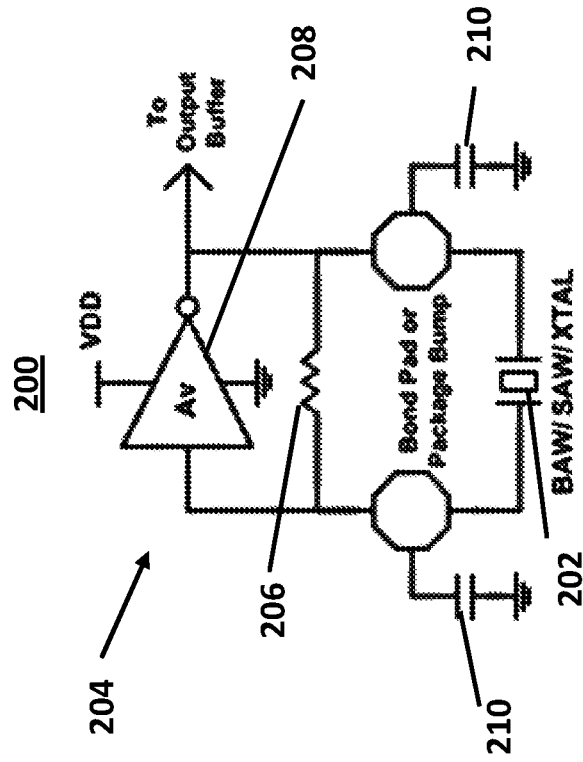
FIG. 2 shows another single-ended oscillator as known in the art.
Figure 1:
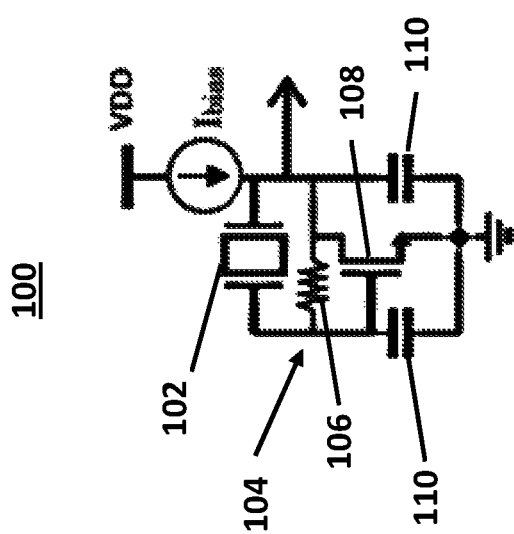
FIG. 1 shows a single-ended oscillator as known in the art.

An oscillator and method for generating differential signals are described. The oscillator comprises an electromechanical resonator and a reconfigurable oscillator driver. The reconfigurable oscillator driver starts the oscillator in single-ended mode to build up oscillations in the resonator, and transitions the oscillator to differential mode. If the oscillator was first started in differential mode, the inverters would latch to constant complementary voltage levels. By starting in single-ended mode, however, the oscillator is allowed to accumulate oscillation energy which is used to continue the oscillations when transitioning to, and while in, differential mode to avoid latching. In differential mode, the signals produced by the oscillator are of better quality than the signals produced in single-ended mode. In other words, the single-ended mode initializes the oscillator into the desired oscillatory state, thereby avoiding the other possible DC latching states. The balanced mode of operation, with maximized steady-state swing, helps the signal form the oscillator exhibit superior performance in phase noise, common-mode noise rejection, and differential clock symmetry. The reconfigurable oscillator driver comprises two back-to-back inverters. In single-ended mode, one inverter is disabled and the other inverter is enabled. To transition to differential mode, both inverters are enabled.

The oscillator for generating a signal comprises an electro-mechanical resonator for creating oscillations in the oscillator; a reconfigurable oscillator driver connected to the electro-mechanical resonator for initiating and sustaining oscillations therein, the reconfigurable oscillator driver operable in a single-ended mode and a differential mode; a controller for starting the reconfigurable oscillator driver in single-ended mode and transitioning to differential mode to avoid latching; and an output driver circuit connected to the electro-mechanical resonator and reconfigurable oscillator driver for outputting the oscillations as a signal. In an embodiment, the output driver circuit comprises a hard-limiter to convert the oscillations to an electronic signal and output the electronic signal. In another embodiment, the output driver circuit comprises either one of a band-pass filter or a tuned amplifier to help output a pure sinusoidal signal. In another embodiment, the output driver circuit outputs a complementary pair of signals. In another embodiment, the reconfigurable oscillator driver comprises two inverters arranged back-to-back to amplify the oscillations by providing negative resistance; and an adjustable feedback resistor connected in parallel with the inverters to decrease the feedback resistance in the oscillator when transitioning between single-ended mode and differential mode to inhibit latching, wherein, when operating in single-ended mode one inverter is disabled and the other inverter is enabled, and when operating in differential mode both of the inverters are enabled. In another embodiment, the reconfigurable oscillator driver comprises two back-to-back banks of inverters, wherein in single-ended mode all inverters from one bank are disabled and two or more inverters from the other bank are enabled, when transitioning between single-ended mode and differential mode at least one inverter is enabled in both banks and a different number of inverters are enabled between each bank, and in differential mode an equal number of inverters are enabled in both banks. In another embodiment, the reconfigurable oscillator driver further comprises an adjustable feedback resistor connected to the banks of inverters to decrease the feedback resistance in the oscillator when transitioning between single-ended mode and differential mode to avoid latching. In another embodiment, the controller comprises counters for controlling the transition of the oscillator from single-ended mode to differential mode. In another embodiment, the counters are connected to the oscillator to receive the signal therefrom for decrementing the counters. In another embodiment, the resonator is a piezoelectric resonator. In another embodiment, the piezoelectric resonator is any one of a bulk acoustic wave resonator, a film bulk acoustic wave resonator, a quartz crystal resonator, and a surface acoustic wave resonator. In another embodiment, the piezoelectric resonator is a bulk acoustic wave resonator integrated with the oscillator in either one of a System-in-Package and System-on-Chip device.

The method for generating a signal comprises operating an oscillator in a single-ended mode; controlling the oscillator to transition without latching to operating in a differential mode; operating the oscillator in differential mode and outputting the signal. In an embodiment, outputting the signal comprises outputting a pair of balanced complementary signals. In an embodiment, outputting the signal comprises outputting an electronic signal. In another embodiment, starting the oscillator in single-ended mode comprises enabling a first inverter, disabling a second inverter arranged back-to-back with the first inverter, and maximizing feedback resistance. In another embodiment, transitioning from single-ended mode to differential mode comprises enabling the second inverter and decreasing the feedback resistance to avoid latching; waiting for the oscillations to reach a steady amplitude state; and increasing feedback resistance to maximize the amplitude and quality of the electronic signal. In another embodiment, starting the oscillator in single-ended mode comprises enabling two or more inverters from a first bank of inverters and disabling all inverters in a second bank of inverters arranged back-to-back with the first bank. In another embodiment, transitioning from single-ended mode to differential mode comprises enabling inverters from the second bank or disabling inverters from the first bank in such a manner as to avoid latching until the number of enabled inverters are equal in both banks. In another embodiment, inverters are enabled or disabled at least one at a time and oscillations are allowed to reach a steady amplitude state between enabling each or disabling the next inverter.

Figure 6A:
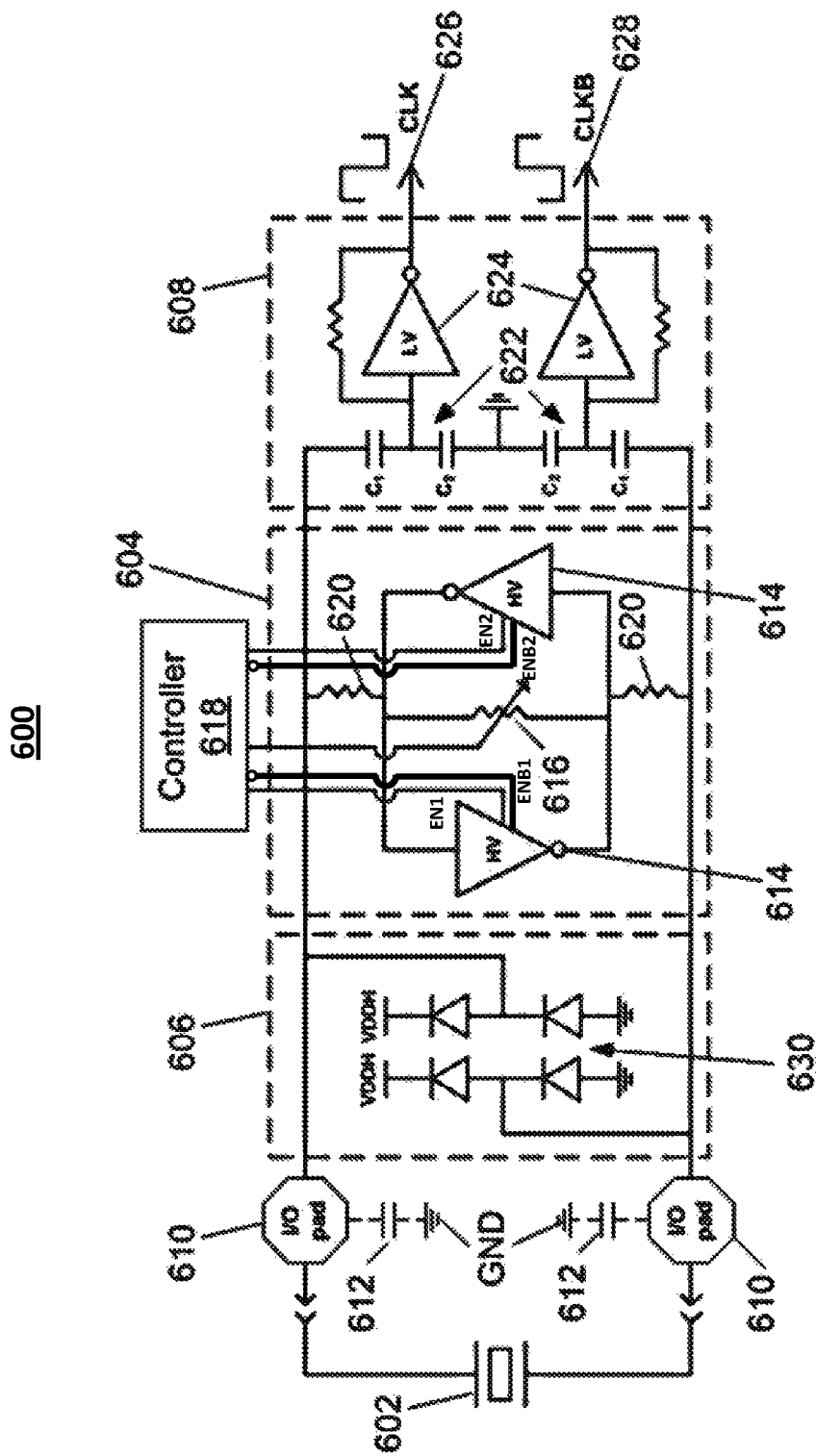
FIG. 6A shows an oscillator in accordance with an embodiment of the present disclosure.

FIG. 6A shows an oscillator 600 for generating electronic signals CLK and CLKB comprising a piezoelectric resonator 602. The oscillator 600 also comprises a reconfigurable oscillator driver 604, an electrostatic discharge circuitry (ESD) 606, and an output driver circuit 608 all connected in parallel with each other and the resonator 602. The resonator 602 is connected via input-output (I/O) pads 610. Between the input-output pads 610 and ground GND are capacitors 612 representing explicit and parasitic capacitances in the oscillator 600.

The reconfigurable oscillator driver 604 comprises two back-to-back inverting gain stages (programmable inverters) 614 with a programmable feedback resistor (feedback resistor) 616 disposed in parallel therebetween. The inverters 614 are powered by a high voltage (HV) power supply. The inverters 614 and the feedback resistor 616 are all individually controllable by a controller 618. Specifically, the inverters 614 can be independently enabled or disabled, and the resistance of the feedback resistor 616 can be set to achieve the desired quiescent point bias and overall frequency-dependent gain. Two resistors 620, with low resistance values, are positioned in series between the inverters 614 and the resonator 602 to provide low-pass filtering thereby mitigating unwanted oscillations caused by package parasitic or overtone modes of the resonator 602.

The output driver circuit 608 buffers electronic oscillations to prevent loading in the oscillator 600. The output driver circuit 608 comprises capacitive voltage dividers 622 to facilitate level shifting of the oscillations from the high-voltage (HV) domain to the low-voltage (LV) domain. Two hard limiters or high-gain inverters 624 buffer the oscillations to generate electronic signal CLK and inverse electronic signal CLKB with CMOS logic levels at outputs 626 and 628, respectively. The electronic signals CLK and CLKB are complementary signals because they are essentially identical except one is the inverse of, or has a phase difference of 180 degrees from, the other. The high-gain inverters 624 are powered by a low-voltage (LV) power supply.

In an alternate embodiment, the output driver circuit is configured to generate sinusoidal, rather than square wave, signals. In this embodiment, the output driver circuit may comprise a band-pass filter and/or a tuned amplifier to help eliminate higher order harmonics and provide pure sinusoidal waveforms with minimum total harmonic distortion.

The ESD 606 comprises two pairs of diodes 630 to help prevent damage that can arise from static charge.

Quartz crystal or surface acoustic wave (SAW) resonators are typically implemented as external components on a printed circuit board (PCB). Resonators of the FBAR/BAW type, however, operate at much higher frequencies and have much smaller physical dimensions than quartz crystals and SAW resonators. Accordingly, FBAR/BAW resonators can be integrated with the oscillator 600 on a silicon die in a System-on-Chip (SoC) device or in a package substrate in a System-in-Package (SiP) device to reduce the parasitic capacitance within the oscillator 600 and reduce the number of pins on the package. Furthermore, avoiding contact with the package pins reduces the amount of electrostatic discharge protection required, which, in turn, reduces the parasitic effect caused by the ESD 606.

Figure 6C:
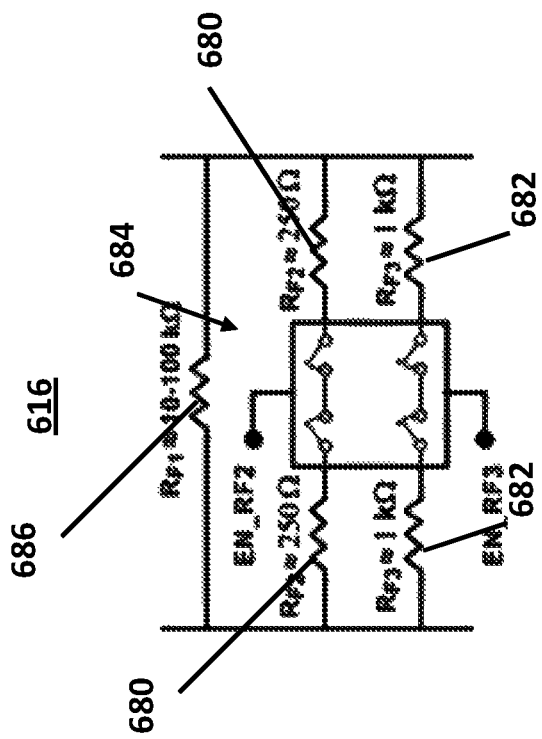
FIG. 6C shows a detailed view of an adjustable feedback resistor of the oscillator as shown in FIG. 6A in accordance with an embodiment of the present disclosure.
Figure 6B:
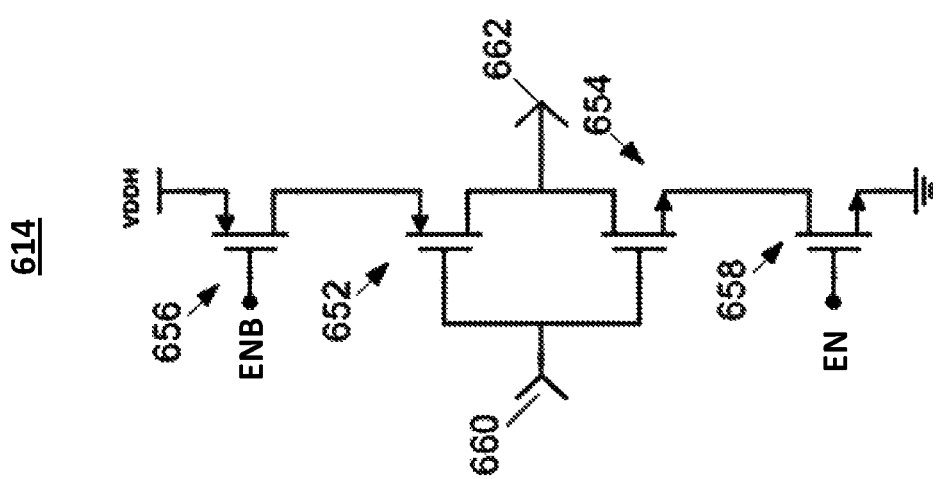
FIG. 6B shows a detailed view of an inverter of the oscillator as shown in FIG. 6A in accordance with an embodiment of the present disclosure.

FIG. 6B shows a detailed view of the inverter 614 of the oscillator shown in FIG. 6A. The inverter 614 comprises two main inverting transistors 652, 654 and large electronic switches (switches) 656, 658. The width of the switches 656, 658 is significantly greater than the width of the transistors 652, 654. For example, the width of the switches 656, 658 can be ten times greater the width of the transistors 652, 654. The main inverting transistors 652,654 provide the gain, while the switches 656, 658 enable and disable the power to the main inverting transistors 652, 654, respectively, via the controller 618. The switches 656, 658 are controlled by the controller 618 by complementary signals EN and ENB, respectively, such that the switches are both opened or closed simultaneously. The input 660 to the inverter 614 receives the oscillations within the oscillator 600. The oscillations are amplified by the main inverting transistors 652, 654, and the amplified oscillations are output at the output 662 of the inverter 614.

FIG. 6C shows a detailed view of the adjustable feedback resistor 616 of the oscillator 600 shown in FIG. 6A. The feedback resistor 616 comprises four switchable shunt resistors (shunt resistors) 680, and 682, in parallel with a fixed resistor 686. In this example embodiment, shunt resistors 680 are the same value and shunt resistors 682 are the same value to preserve the symmetry of the oscillator. In this embodiment, shunt resistors 680 are 250 ohms and shunt resistors 682 are 1 kilo ohm, and the fixed resistor 686 has a large value typically between 10 kilo ohms to 100 kilo ohms. In other embodiments, further resistors and switches can be connected as part of the feedback resistor 616 in parallel thereto. The feedback resistor 686 is required for the quiescent point bias when operating the oscillator 600 in single-ended mode. Each of the shunt resistors 680, 682 is connected, and independently controllable, by a switch 684. The switch 684 is connected to and controlled by the controller 618.

Figure 6D:
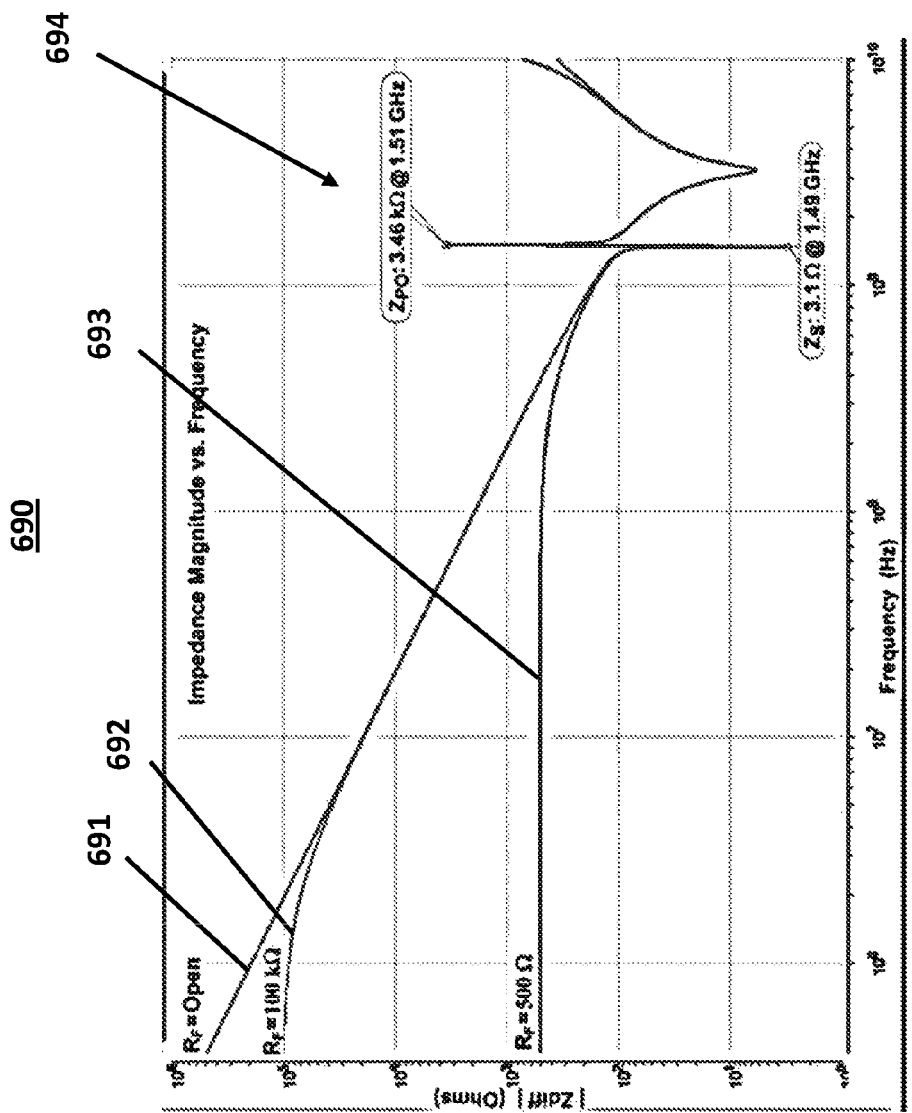
FIG. 6D shows a graph plotting load impedance against frequency for an embodiment of the oscillator as shown in FIG. 6A.

FIG. 6D shows a graph 690 plotting load impedance (y-axis), as observed by the oscillator driver circuit 604, against frequency (x-axis) for an embodiment of the oscillator 600 as shown in FIG. 6A. The oscillator 600 comprised a 1.5 GHz FBAR resonator 602. Plots for three different feedback resistance values $R_F$ for the feedback resistor 616 are used, namely, $R_F$=infinity (open) at 691, 100 kilo ohms at 692, and 500 ohms (2×250 ohms) at 693. The graph 690 shows that the load impedance of the oscillator 600 decreases as the frequency increases up until around the resonance frequencies of the resonator 602 at 694 (1.5 GHz).

Figure 6E:
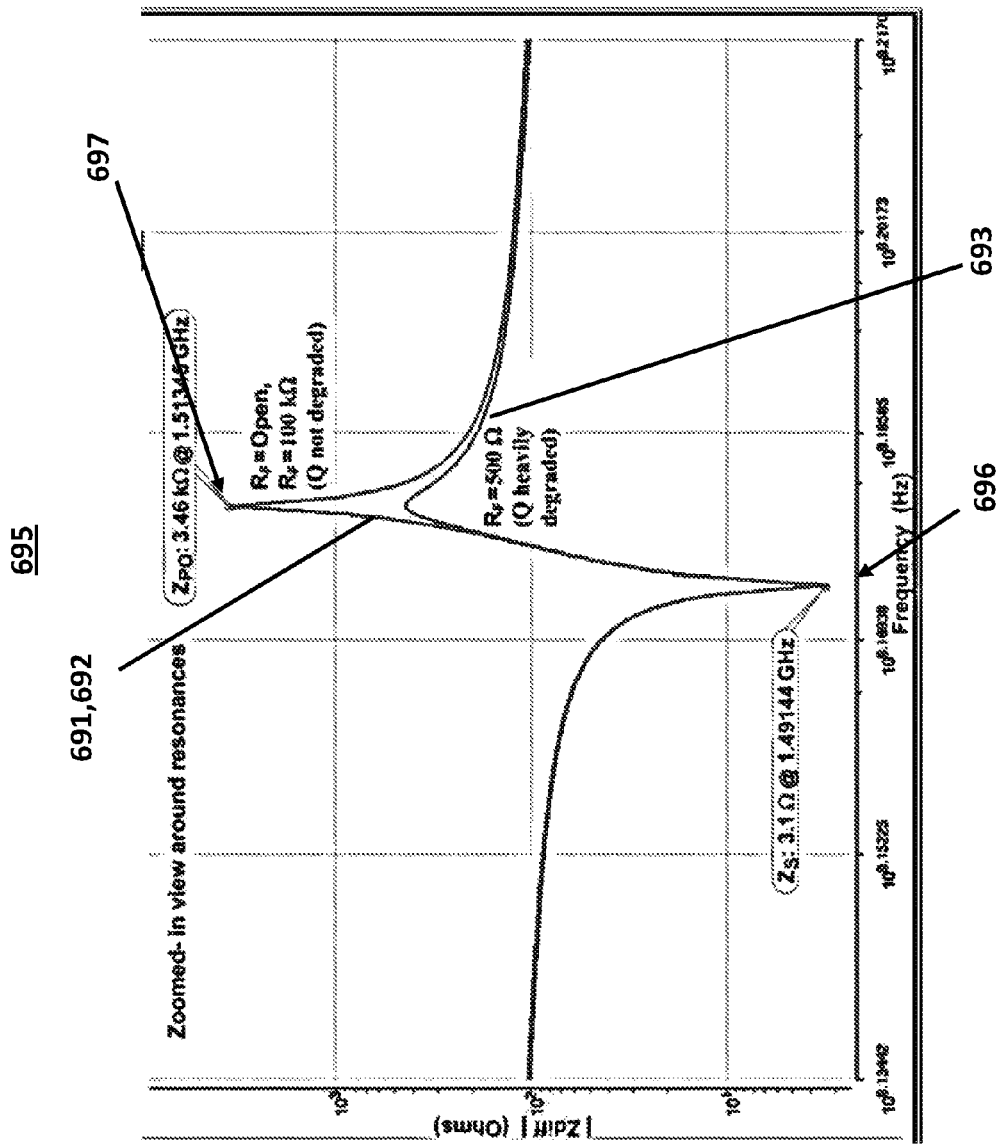
FIG. 6E shows a graph magnifying an area of the graph shown in FIG. 6D.

FIG. 6E shows a graph 695 magnifying the area around the resonance frequencies 694 of the graph 690 shown in FIG. 6D. Graph 695 shows the plots 691, 692 and 693 at a first resonance frequency 696 and a second resonance frequency 697. At the first resonance frequency 696 (the series resonance frequency) the load impedance approaches a short circuit and attains a minimum load impedance value. At the second resonance frequency (the parallel resonance frequency), the resonator approaches an open circuit behavior and attains peak load impedance. Since the oscillator 600 was designed to oscillate near the parallel resonance frequency 697, the overall loop gain depends upon the peak load impedance thereat. Generally, a higher load impedance value at the parallel resonance frequency will yield higher oscillation swings and better phase noise performance.

Referring again to FIG. 6D, as the frequency of the oscillator 600 increases beyond the resonance frequency 694, the load impedance first decreases and again peaks. This peak is due to parasitic inductances from package interconnects. Accordingly, resistors 620 are used to suppress load impedance peaking caused by parasitic inductances and to help prevent unwanted oscillations.

Figure 7:
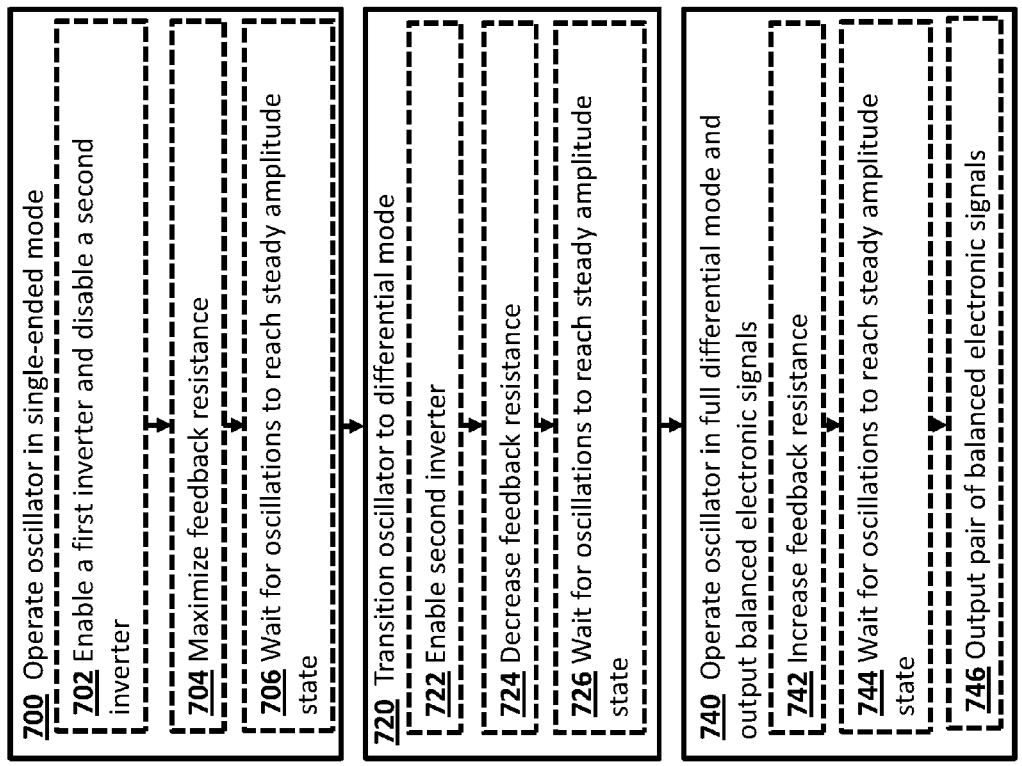
FIG. 7 shows a flow chart of a method for operating the oscillator of FIG. 6A.

FIG. 7 shows a method for operating the oscillator 600 shown in FIG. 6A. The oscillator 600 is first operated in single-ended mode 700. To do so, in an example embodiment, the reconfigurable oscillator driver 604 is set to single-ended mode by enabling one of the inverters 614 and disabling the other inverter 614, as shown at 702, with the controller 618. In an example embodiment, the feedback resistance of the feedback resistor 616 is maximized, as shown at 704. For all intents and purposes, in single-ended mode, the reconfigurable oscillator driver 604 causes the oscillator 600 to act like a single-ended Pierce oscillator. This prevents the gates of the transistors 652, 654 from latching to the complementary voltage levels. The value of the feedback resistor 616 is set to between 10 kilo ohms and 100 kilo ohms so that it does not noticeably degrade the overall quality factor of the oscillations, as depicted in FIG. 6E. The oscillator 600 then waits for a period of time until the oscillations reach a steady amplitude state as shown in 706.

In single-ended mode, oscillations occur reliably and the amplitude of the oscillation voltage across the resonator 602 increases steadily before reaching a steady amplitude state, namely, where the amplitude of the oscillations is the same for all oscillation cycles. The time it takes for oscillations to reach a steady amplitude state is proportional to the loaded quality (Q) factor of the oscillator 600. Similarly, the time it takes for the oscillations to die out is also proportional to the quality factor of the oscillator 600. Oscillators using a resonator with a high quality factor require more time to attain oscillations with a steady amplitude state when a power source is applied, but can also reliably sustain oscillations for a longer period of time upon removal of the power source or incurring large transient disturbances such as those caused by the transition from single-ended mode to differential mode.

Figure 8B:
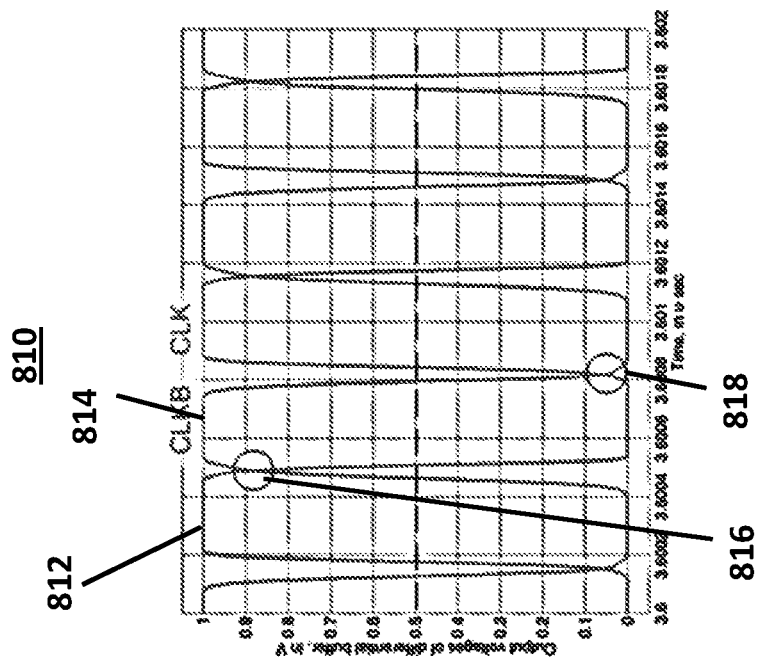
FIG. 8B shows a graph of a signal output by the oscillator of FIG. 6A operating in single-ended mode.
Figure 8A:
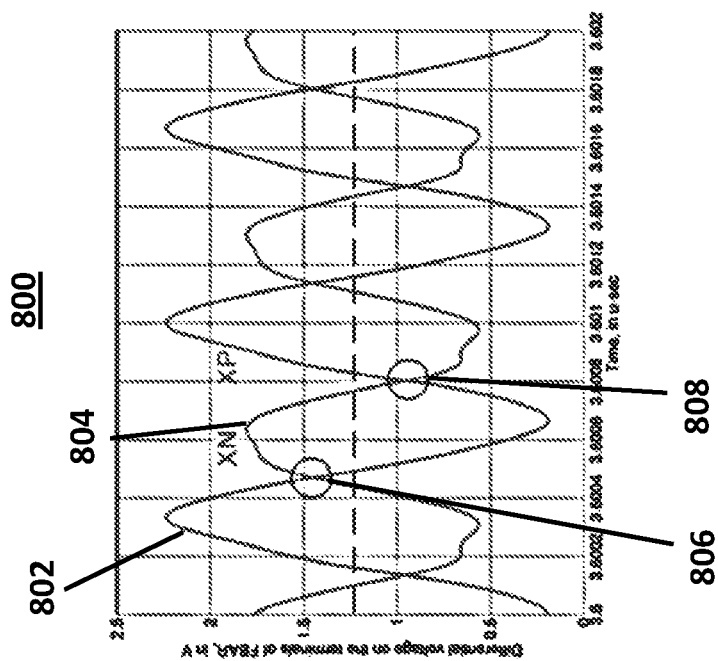
FIG. 8A shows a graph of oscillations at the terminals of a resonator in the oscillator as shown in FIG. 6A operating in single-ended mode.

FIGS. 8A and 8B show graphs of analog and digital waveforms, 800 and 810, respectively, generated by an oscillator similar to the oscillator 600 shown in FIG. 6A, operating in single-ended mode. The waveforms were produced according to an example embodiment of the oscillator 600 developed by way of a 65 nm CMOS process. The inverters 614 were biased with a 2.5 Volt high voltage (HV) power supply, and gain inverters 624 were biased with a 1.0 Volt low voltage (LV) supply. The resonator 602 was a 1.5 GHz FBAR resonator, the feedback resistor 616 was set in the range of 10 to 100 kilo ohms, and the resistors 620 were 25 ohms each.

The x-axes of the graphs correspond to the time in microseconds (µs), and the y-axes of the graphs correspond to the voltages at the terminals of the resonator 602. Waveform 802 was observed at the terminal of the resonator 602 which communicates with the output of the enabled inverter 614, and waveform 804 was observed at the side of the resonator which communicates with the input of the enabled inverter 614. Waveform 812 was observed at the output 626 and waveform 814 was observed at the inverse output 628.

As is shown at the waveform crossing points 806 and 808, different parasitic loading at the terminals of the resonator 602 results in significant asymmetry in voltage swing, both in amplitude and in phase. When the unbalanced pair of waveforms 802, 804 are input to the output driver circuit 608, the asymmetry results in asymmetric crossing that manifests as clock skew and duty-cycle distortion (DCD) at the output 626 and inverse output 628 as is shown at points 816 and 818.

Once the resonator 602 reaches a steady amplitude state, the oscillator 600 can be transitioned to the differential mode without resulting in latching as shown at 720. In other words, by transitioning to the differential mode in a state with sufficient oscillation energy in the resonator 602, the reconfigurable oscillator driver 604 avoids reverting to a DC stable state where the gates of the transistor 614 would latch to complementary high and low voltage levels. What permits this transition is the high quality factor of the resonator, which keeps the oscillation going during the transition.

Referring back to FIG. 7, to transition 720 to differential mode from single-ended mode in an example embodiment, both inverters 614 are enabled 722 by the controller 618. The controller 618 also reduces the loop gain by decreasing 724 the feedback resistance (ohm value or shunting load) of the feedback resistor 616 so that they are approximately five to ten times smaller than the intrinsic impedance of the resonator 602 at parallel resonance. Enabling both inverters 722 causes both terminals of the resonator 602 to experience the same parasitic loading. Decreasing the feedback resistance, or shunting load resistance, reduces the quality factor across the resonator 602, however, and counteracts excessive differential gain resulting in degradation in the voltage swings at the terminals of the resonator 602 ($|Z_{PO}|$ in FIGS. 6D and 6E). Failure to decrease the feedback resistance or shunting load of the feedback resistor 616 would cause excessive differential gain and cause the output 626 and negative output 628 to latch to static voltage levels. The tendency to latch increases at high-gain Process, Voltage and Temperature (PVT) corners.

The controller 618 must wait a period of time 726, namely until the oscillations reach a steady amplitude state, before operating the oscillator 600 in full differential mode and outputting electronic signals as shown at 740. To operate the oscillator 600 in full differential mode, the value of the feedback resistor 616 is increased 742 to maximize the quality factor of the resonator 602. Increasing feedback resistance allows the voltage swing at the terminals of the resonator 602 to be higher and results in improvements in phase noise. The value of the feedback resistor 616 can be increased 742 progressively in two or more steps. The higher the final feedback resistance in full differential mode, the better the phase noise. The final feedback resistance, however, should not exceed the value as originally set in single-ended mode. After increasing the feedback resistance 742, the oscillator 600 must wait a period of time for the oscillations to reach a steady amplitude state 744. Upon reaching the steady amplitude state, the oscillator 600 is operating in full differential mode and outputs a pair of complementary balanced electronic signals 746.

The controller 618 controls starting the oscillator 600 in single-ended mode, transitioning the oscillator 600 to differential mode, and operating the oscillator 600 in differential mode. In an embodiment, the controller 618 is a sequential logic circuit that controls the sequence and timing of enabling and disabling the inverters 614 and the value of the feedback resistor 616 in accordance with the method described in relation to FIG. 7.

In an example embodiment, the controller 618 comprises three counters with pre-loaded values: a first counter for operating the oscillator 600 in single-ended mode 700, a second counter for transitioning the oscillator 600 to differential mode 720, and a third counter for operating the oscillator in full differential mode 740. The controller 618 is driven or clocked by the electronic signal CLK from the oscillator 600. Specifically, the output 626 of the oscillator 600 is connected to the input clocks of the counters.

In single-ended mode 700, each rise of the clock edge of the electronic signal CLK causes the first counter to decrement by one until it reaches zero. When the first counter reaches zero, the controller 618 causes the oscillator 600 to transition to differential mode 720, namely, the second inverter is enabled 722, the feedback resistance of the feedback resistor 616 is decreased 724, and the second counter begins to count down from an amount sufficient for the oscillations to reach a steady amplitude state 726 upon the second counter reaching zero.

The second counter is also clocked using the electronic signal CLK from the oscillator 600. When the second counter reaches zero, it causes the controller 618 to operate the oscillator in full differential mode 740 by increasing the feedback resistance of the feedback resistor 616 and commencing the third counter to count down to wait for oscillations to reach a steady amplitude state 744. Upon the third counter reaching zero, a pair of complementary balanced electronic signals CLK, CLKB are output 746 by the oscillator 600.

Figure 9:
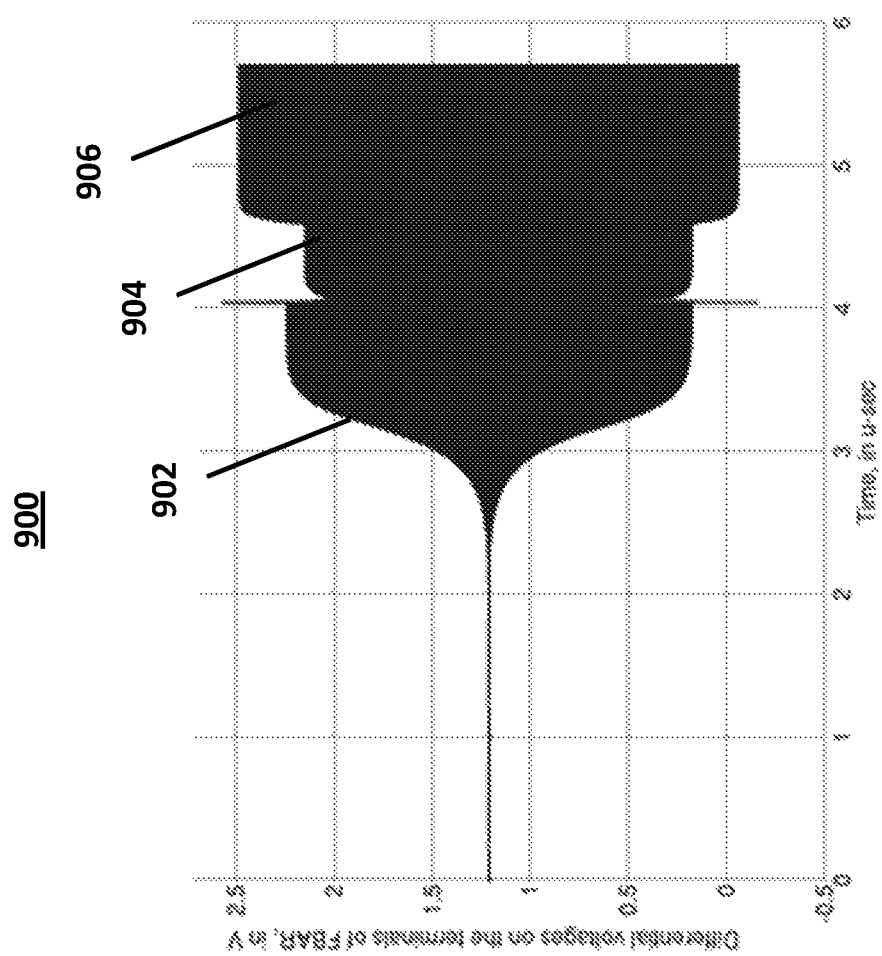
FIG. 9 shows a graph of the voltage swing at the terminals of a resonator in the oscillator shown in FIG. 6A as it transitions from single-ended mode to differential mode.

The pre-loaded values of the counters generally correspond to the amount of time required for the oscillations in the oscillator 600 to reach a steady amplitude state. A conservative pre-loaded value for all counters is $2Q_i$, where $Q_i$ is the estimated loaded quality factor of the resonator 602. As previously noted, the amount of time required for oscillations to reach a steady amplitude state is proportional to the loaded Q factor of the oscillator with resonator. Counting down from twice the value of $Q_i$ should be sufficient for the oscillations in the oscillator 600 to reach a steady amplitude state. The longest amount of time required for the oscillator 600 to reach a steady amplitude state is during startup in single-ended mode as shown at 902 (FIG. 9).

The unloaded Q factor of the resonator can be determined based on the resistance, inductance, and capacitance values in the resonator's mBVD circuit model as shown in FIG. 3B. The equation to calculate the unloaded parallel resonance quality factor of the resonator is $$Q_{p0} = \frac{2\pi f_p L_m}{R_m + R_o}, \quad \text{(equation 1)}$$

where $f_p$ is the parallel resonance frequency that corresponds to the peak impedance of the resonator and is approximately equal to $$f_p \approx \frac{1}{2\pi\sqrt{\frac{L_m C_m C_o}{C_m + C_o}}}, \quad \text{(equation 2)}$$

$L_m$ is the value of the resonator's motional inductance, $C_m$ is the value of the resonator's motional capacitance, $C_o$ is the value of the resonator's plate capacitance, and $R_m$ and $R_o$ are loss resistors in series with $C_m$ and $C_o$, respectively.

Referring to FIG. 6E, the parallel resonance 697 where there is peak load impedance $Z_{PO}$ for plot 691 ($R_F$=infinity) represents the equivalent intrinsic shunt resistance of the resonator 602. When an explicit shunt resistor $R_F$ is added to the oscillator 600, the loaded quality factor of the oscillator 600 is reduced by an amount proportional to the reduction in the overall shunt resistance as described by the following equation: $Q_{p,Loaded} = Q_{p0} \times (R_F || Z_{PO}) / Z_{PO}$ (equation 3), where $Q_{p,Loaded}$ is the loaded quality factor of the oscillator at parallel resonance. FIGS. 6D and 6E show $|Z_{PO}|$=3.46 kilo ohms. Accordingly, the impedance characteristics and $Q_p$ of plot 692 ($R_F$=100 kilo ohms) remains virtually the same as the unloaded plot 691 ($R_F$=Open). On the other hand, plot 693 ($R_F$=500 ohms) has heavily loaded and degraded $Q_p$ as well as the peak impedance at parallel resonance.

FIG. 9 shows a graph 900 plotting the voltage at the terminals of the resonator 602 over time in microseconds for operating the oscillator 600 in single-ended mode 902, transitioning the oscillator to differential mode 904, and operating the oscillator in differential mode 906.

Figure 10B:
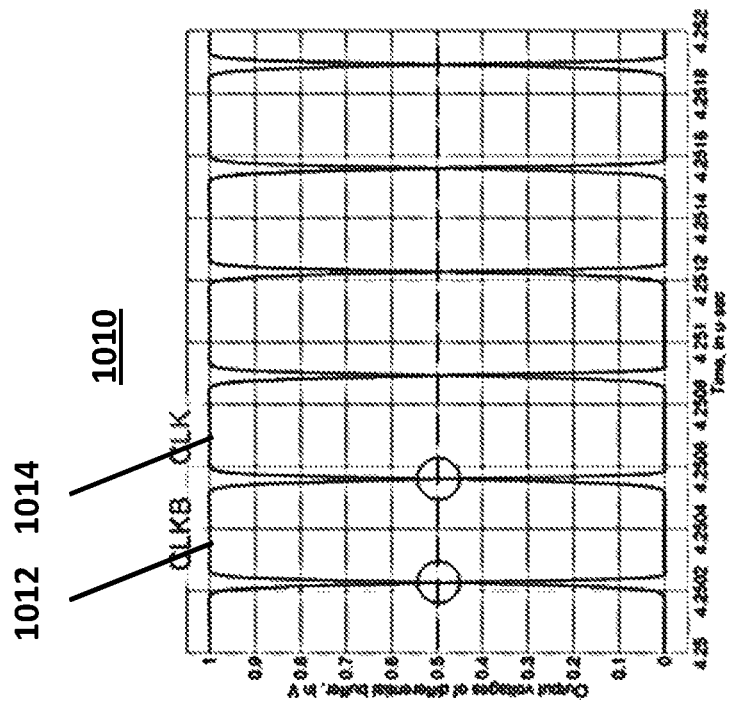
FIG. 10B shows a graph of balanced signals output by the oscillator shown in FIG. 6A operating in single-ended mode.
Figure 10A:
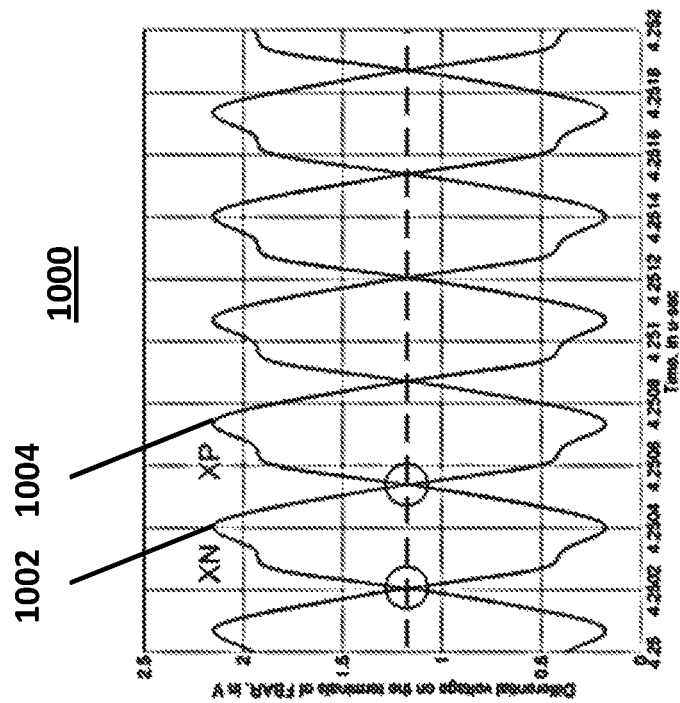
FIG. 10A shows a graph of oscillations at the terminals of a resonator in the oscillator shown in FIG. 6A operating in differential mode.

FIGS. 10A and 10B show analog and digital waveforms, 1000 and 1010, respectively, generated by an oscillator similar to the oscillator 600 of FIG. 6A, operating in differential mode with high feedback resistance. The x-axes of the graphs correspond to time in microseconds, and the y-axes of the graphs correspond to the differential voltage at the terminals of the resonator 602. Waveforms 1002, 1004 were observed at the terminals of the resonators 602. Waveforms 1012, 1014 were observed at the output 626 and inverse output 628.

In differential mode, the voltage swing across the resonator 602 is maximized, and the phase noise, common mode noise rejection, and differential clock symmetry in the electronic signals are improved. Specifically, enabling both inverters helps equalize parasitic loading on the terminals of the resonator 602 causing the voltage signals on the terminals to have essentially identical amplitude and shape, and have a 180 degrees phase difference. In differential mode, the electronic signals CLK, CLKB at the output 626 and inverse output 628 do not exhibit systemic clock skew and duty cycle distortion as is shown in relation to FIG. 8B for single-ended mode. Edge rates of the electronic signals CLK, CLKB are also faster compared to single-ended mode, which helps to make the electronic signals CLK, CLKB immune from noise.

Figure 11:
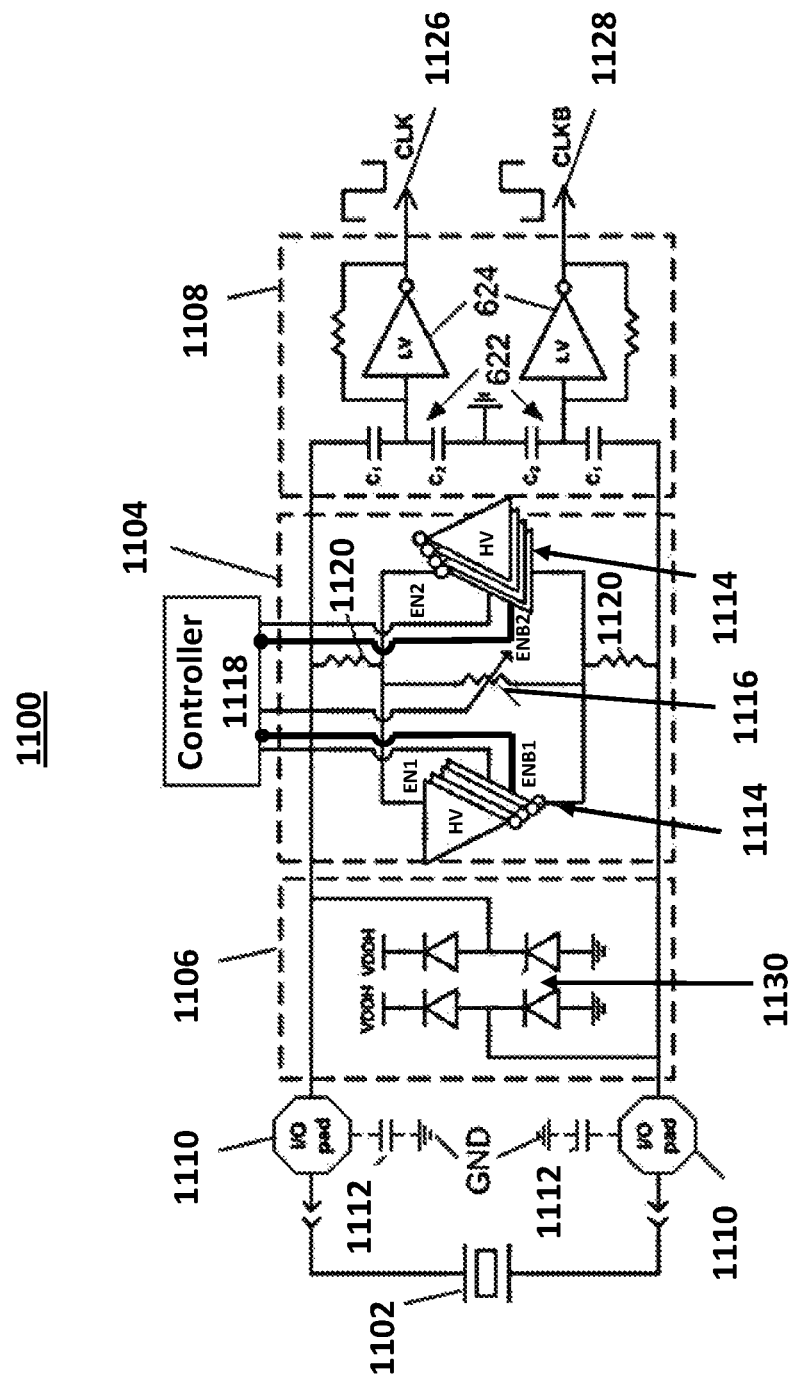
FIG. 11 shows another oscillator in accordance with an embodiment of the present disclosure.

FIG. 11 shows an oscillator 1100 which is similar to the oscillator 600 as shown in FIG. 6A, the difference being that instead of only a pair of back-to-back inverters 614, two back-to-back banks of inverters 1114 are used. Each bank 1114 comprises multiple parallel inverters which are each individually controllable by the controller 1118. In an embodiment, the parallel inverters 1114 and feedback resistor 1116 are digitally programmable. By using two banks of inverters, an adjustable feedback resistor 1116 is not necessarily required. Including an adjustable feedback resistor 1116, however, provides flexibility to the design and application. A fixed feedback resistor is still required, however, for the quiescent point bias when operating the oscillator 1100 in single-ended mode.

Figure 12:
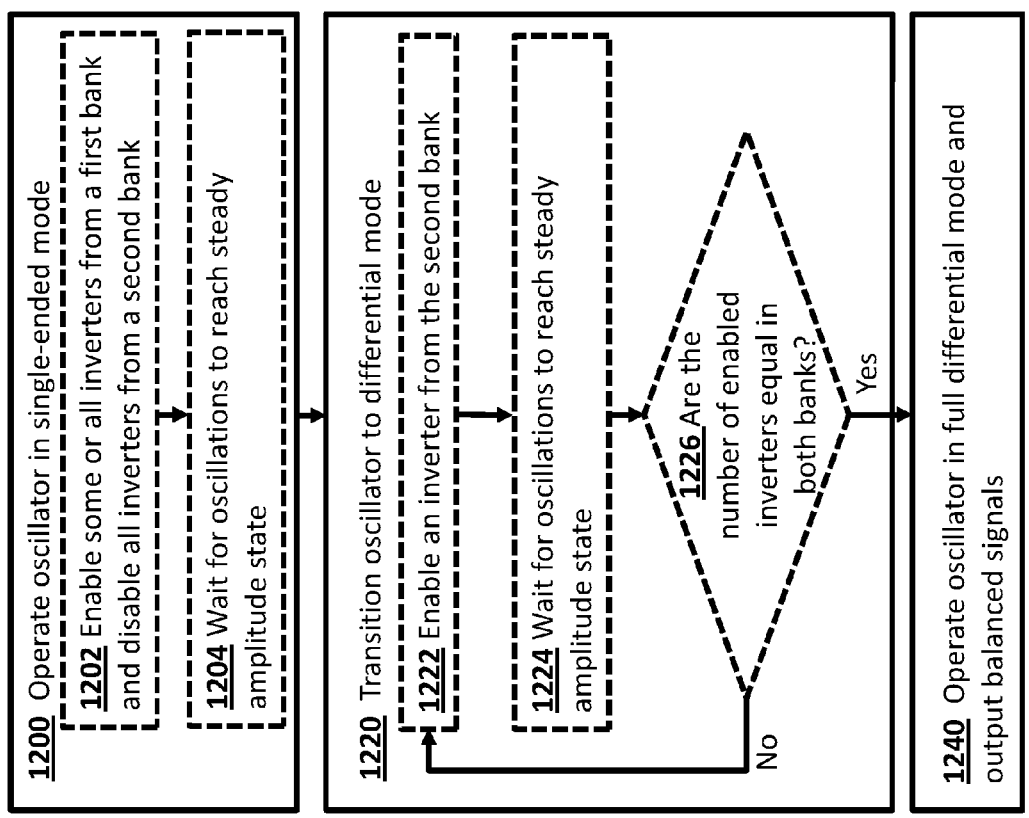
FIG. 12 shows a flow chart of a method for operating the oscillator shown in FIG. 11.

FIG. 12 shows a flow chart of a method for operating the oscillator 1100 shown in FIG. 11. The method comprises operating the oscillator 1100 in single-ended mode 1200 by enabling some or all of the inverters from one bank 1114 and disabling all of the inverters from the other bank 1202. A period of time is allowed to pass to allow the oscillations in the oscillator 1100 to stabilize such that oscillations reach a steady amplitude state 1204.

Since capacitances on the terminals of the resonator 1102 are generally inversely proportional to frequency, a larger number of inverters of one bank 1214 are generally required to be enabled to ensure oscillation for resonators with lower frequencies. Indeed, for each resonator 1102, there is an optimum number of inverters 1114 to enable during single-ended mode. The optimum number of inverters 1114 depends on the R, L, and C values of the mBVD model circuit of the resonator 1102. This is because enabling an additional parallel inverter 1112 of a bank increases drive strength and swing level across the resonator 1102 while also increasing the parasitic capacitances and loading the resonator 1102.

To transition to differential mode, the controller 1118 enables the inverters 1222, one at a time, from the initially disabled bank 1114. Each time an inverter of the initially disabled bank 1114 is enabled, the controller 1118 must wait a period of time 1224 until the oscillations in the oscillator 600 reach a steady amplitude state. The time it takes for the oscillations to stabilize is proportional to the loaded quality factor of the resonator 1102. As each inverter 1114 of the initially disabled bank is enabled 1222, the parasitic loading on the terminals of the resonator 1102 also comes closer to being equal, and the oscillator 1100 is nudged closer to operating in fully-balanced differential mode. A check is performed to determine whether the number of enabled inverters is equal in both banks 1114 as shown in 1226. The oscillator 1100 becomes fully balanced such that it operates in full differential mode and outputs electronic signals CLK and CLKB as shown at 1240, when the same number of inverters is enabled in both banks 1114.

Transitioning from single-ended mode to differential mode by enabling inverters 1114 in a bank can also be combined, in some combination, with changing the feedback resistance 1116. This is accomplished by progressively increasing the number of enabled inverters of a bank 1114 until it equals the number of enabled inverters of the other bank 1114 while decreasing and increasing the feedback resistance of the feedback resistor 1116 to change the loaded quality factor of the resonator 1102 and the loop gain.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block and/or circuit diagram form in order not to obscure the understanding. For example, specific details are not provided as to whether the embodiments described herein are implemented as a software routine, hardware circuit, firmware, or a combination thereof.

Certain embodiments of the disclosure, including but not limited to, the controllers 618, and 1118 can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read-only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skilled in the art without departing from the scope, which is defined solely by the claims appended hereto.

What is claimed is:

1. An oscillator, comprising:
   an electro-mechanical resonator that generates a resonator signal for creating oscillations in the oscillator;
   an oscillator driver coupled to the resonator, the oscillator driver configured to contribute a gain to the oscillations and operable in single-ended mode and differential mode;
   a controller in communication with the oscillator driver and configured to start the oscillator driver in single-ended mode and transition the oscillator driver to the differential mode, the controller configured to reduce the gain contributed by the oscillator driver when transitioning between single-ended mode and differential mode, wherein the oscillator driver comprises:
   a first inverter and a second inverter arranged back-to-back and configured to contribute the gain to the oscillations in the oscillator; and
   an adjustable negative feedback resistor connected in parallel with the first and second inverters and in communication with the controller, the controller configured to decrease the resistance of the adjustable negative feedback resistor to reduce the gain when transitioning from the single-ended mode to the differential mode to inhibit the oscillator from latching to a non-oscillatory direct current stable state.

2. The oscillator of claim 1, wherein the controller is configured to increase the gain contributed by the oscillator driver to the oscillations in response to the oscillations reaching a steady amplitude state when the oscillator driver is in the differential mode to increase the amplitude or reduce the phase noise of the oscillations.

3. The oscillator of claim 1, wherein the controller is configured to disable the first inverter and enable the second inverter to operate in the single-ended mode, and enable the first and second inverters to operate in differential mode.

4. The oscillator of claim 1, wherein the oscillator driver comprises two back-to-back banks of one or more inverters, and wherein in the single-ended mode a different number of inverters is enabled in each bank of inverters, and in the differential mode an equal number of inverters are enabled in both banks of inverters.

5. The oscillator of claim 4, wherein the controller is configured to disable one or more inverters in the banks of inverters to reduce the gain to inhibit the oscillator from latching to the non-oscillatory direct current stable state.

6. The oscillator of claim 1, wherein the controller comprises a counter, the counter configured to count a number of the oscillations in the oscillator and cause the controller to transition the oscillator from the single-ended mode to the differential mode in response to the number of oscillations reaching a threshold number.

7. The oscillator of claim 1, wherein the electro-mechanical resonator is connected to a resonator input to the oscillator.

8. The oscillator of claim 7, wherein the electro-mechanical resonator is a bulk acoustic wave resonator, or a thin-film bulk acoustic resonator integrated with the oscillator in either one of a System-in-Package (SiP) and System-on-Chip (SoC) device.

9. The oscillator of claim 7, wherein the electro-mechanical resonator is a thin-film bulk acoustic resonator, a bulk acoustic wave resonator, a surface acoustic wave resonator or a quartz crystal resonator.

10. The oscillator of claim 1, wherein the oscillator comprises electrostatic discharge circuitry with two pairs of diodes coupled between a supply voltage and ground.

11. An oscillator, comprising:
    an electro-mechanical resonator that generates a resonator signal for creating oscillations in the oscillator;
    an oscillator driver connected to the resonator input, the oscillator driver operable in a single-ended mode and a differential mode and comprising two back-to-back banks of one or more inverters, the inverters configured to contribute gain to the oscillations in the oscillator, and each of the inverters having a switchable connection; and
    a controller in communication with the switchable connections, the controller configured to, using the switchable connections, start the oscillator driver in the single-ended mode by permitting a different number of inverters in each bank of inverters to receive power, and transition the oscillator driver to the differential mode by reducing the difference between the number inverters in each of the banks of inverters.

12. The oscillator of claim 11, wherein the oscillator comprises electrostatic discharge circuitry with two pairs of diodes coupled between a supply voltage and ground.

13. The oscillator of claim 11, wherein the oscillator driver is coupled by a direct current (DC) connection to the resonator input.

14. The oscillator of claim 11, wherein the controller is configured to reduce the gain contributed by the inverters to the oscillations when transitioning from the single-ended mode to the differential mode to inhibit the oscillator from latching to the non-oscillatory direct current stable state.

15. The oscillator of claim 14, wherein the controller is configured to, using the switchable connections, restrict power to one or more inverters in the banks of inverters to reduce the gain.

16. The oscillator of claim 14, wherein the oscillator driver comprises an adjustable negative feedback resistor connected in parallel with the inverters and in communication with the controller, the controller configured to decrease the resistance of the adjustable negative feedback resistor to reduce the gain contributed by the inverters to the oscillations.

17. The oscillator of claim 14, wherein, in response to the oscillations reaching a steady amplitude state in the differential mode, the controller is configured to increase the gain contributed by the inverters to the oscillations to increase the amplitude of, or to reduce the phase noise in, the oscillations.

18. The oscillator of claim 16, wherein, in response to the oscillations reaching a steady amplitude state in the differential mode, the controller is configured to increase the resistance of the adjustable negative feedback resistor to increase the gain contributed by the inverters to the oscillations to increase the amplitude of, or reduce the phase noise in, the oscillations.

19. An oscillator, comprising:
an electro-mechanical resonator that generates a resonator signal for creating oscillations in the oscillator;
an oscillator driver connected to the resonator, the oscillator driver configured to contribute a gain to the oscillations and operable in single-ended mode and differential mode;
a controller in communication with the oscillator driver and configured to start the oscillator driver in single-ended mode and transition to differential mode;
an adjustable negative feedback resistor connected to the oscillator driver, the controller configured to decrease the resistance of the adjustable negative feedback resistor when transitioning from single-ended mode to differential mode.

20. The oscillator of claim 19, wherein the oscillator comprises electrostatic discharge circuitry with two pairs of diodes coupled between a supply.

21. The oscillator of claim 19, wherein the oscillator driver is coupled by a direct current (DC) connection to the resonator.

22. The oscillator of claim 19, wherein the oscillator driver comprises two back-to-back banks of one or more inverters connected in parallel with the negative feedback resistor and in communication with the controller, the controller configured to decrease the resistance of the adjustable negative feedback resistor to reduce the gain contributed by the inverters to the oscillations.

23. The oscillator of claim 22, wherein, in response to the oscillations reaching a steady amplitude state in differential mode, the controller is configured to increase the gain contributed by the inverters to the oscillations to increase the amplitude of, or to reduce the phase noise in, the oscillations.

24. An oscillator, comprising:
an electro-mechanical resonator that generates a resonator signal for creating oscillations in the oscillator;
an oscillator driver coupled to the resonator, the oscillator driver configured to contribute a gain to the oscillations and operable in single-ended mode and differential mode;
a controller in communication with the oscillator driver and configured to start the oscillator driver in single-ended mode and transition the oscillator driver to the differential mode, the controller configured to reduce the gain contributed by the oscillator driver when transitioning between single-ended mode and differential mode, wherein the oscillator driver comprises two back-to-back banks of one or more inverters, and wherein in the single-ended mode a different number of inverters is enabled in each bank of inverters, and wherein in the differential mode an equal number of inverters are enabled in both banks of inverters.

25. The oscillator of claim 24, wherein the controller is configured to increase the gain contributed by the oscillator driver to the oscillations in response to the oscillations reaching a steady amplitude state when the oscillator driver is in the differential mode to increase the amplitude or reduce the phase noise of the oscillations.

26. The oscillator of claim 24, wherein the controller is configured to disable one or more inverters in the banks of inverters to reduce the gain to inhibit the oscillator from latching to the non-oscillatory direct current stable state.

27. The oscillator of claim 24, wherein the controller comprises a counter, the counter configured to count a number of the oscillations in the oscillator and cause the controller to transition the oscillator from the single-ended mode to the differential mode in response to the number of oscillations reaching a threshold number.

28. The oscillator of claim 24, wherein the electro-mechanical resonator is connected to a resonator input to the oscillator.

* * * * *